US006369613B1

(12) United States Patent
Costello et al.

(10) Patent No.: US 6,369,613 B1
(45) Date of Patent: Apr. 9, 2002

(54) INPUT/OUTPUT DRIVERS

(75) Inventors: John Costello, San Jose; Behzad Nouban, Fremont, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/558,537

(22) Filed: Apr. 26, 2000

Related U.S. Application Data

(60) Provisional application No. 60/133,384, filed on May 10, 1999.

(51) Int. Cl.[7] ........................................... H03K 19/0175
(52) U.S. Cl. .............................. 326/83; 326/86; 326/63; 326/68; 326/58; 327/333
(58) Field of Search .............................. 326/62, 63, 68, 326/80, 81, 83, 56, 57, 58; 327/333

(56) References Cited

U.S. PATENT DOCUMENTS

| 5,559,996 A | * | 9/1996 | Fujioka ..................... 395/500 |
| 5,818,257 A | | 10/1998 | Villa ........................... 326/81 |
| 5,819,099 A | | 10/1998 | Ovens ................... 395/750.01 |
| 6,005,413 A | * | 12/1999 | Schmitt ....................... 326/80 |
| 6,025,737 A | * | 2/2000 | Patel et al. .................. 326/80 |
| 6,107,830 A | * | 8/2000 | Okumura ..................... 326/58 |
| 6,118,302 A | | 9/2000 | Turner et al. ................. 326/68 |
| 6,147,510 A | * | 11/2000 | Pappert ....................... 326/56 |
| 6,147,511 A | | 11/2000 | Patel et al. .................. 326/81 |
| 6,154,059 A | * | 11/2000 | Cheung et al. ............... 326/83 |
| 6,163,179 A | * | 12/2000 | Huang et al. ............... 327/108 |

OTHER PUBLICATIONS

"Altera Supports Mixed–Voltage Systems with New Multi-Volt Interface", Altera Corporation, San Jose, CA, Press Release Dated Apr. 7, 1997.
"Using Selectable I/O Standards in Altera Devices", Altera Corporation, San Jose, CA, Application Note 117, Ver. 1.0, Oct. 1999, pp. 1–17, 20.

Ohtomo et al., "A Quarter–micron SIMOX–CMOS LVTTL–compatible Gate Array with an over 2,000 V ESD–protection circuit", IEEE 1996 Custom Integrated Circuits Conference, pp. 57–60.
Dobberpuhl et al., "A 200–MHz 64–b Dual–Issue CMOS Microprocessor", IEEE Journal of Solid–State Circuits, Nov. 1992, vol. 27, No. 11, pp. 1555–1564.
Patel et al., "A 3.3–V Programmable Logic Device that Addresses Low Power Supply and Interface Trends", IEEE 1997 Custom Integrated Circuits Conference, pp. 539–542.
Sanchez et al., "A Versatile 3.3/2.5/1.8–V CMOS I/O Driver Built in a 0.2–um, 3.5–nm Tox, 1.8–V CMOS Technology", IEEE Journal of Solid–State Circuits, Nov. 1999, vol. 34, No. 11, pp. 1501–1511.
Singh et al., "High–Voltage–Tolerant I/O Buffers with Low–Voltage CMOS Process", IEEE Journal of Solid–State Circuits, Nov. 1999, vol. 34, No. 11, pp. 1512–1525.

* cited by examiner

Primary Examiner—Michael Tokar
Assistant Examiner—Vibol Tan
(74) Attorney, Agent, or Firm—Fish & Neave; Jeffrey H. Ingerman; Joo-Youn Park

(57) ABSTRACT

A technique is provided for improving the output drive capacity of output drivers on an integrated circuit that is configured to support I/O standards having operating voltages greater than the intrinsic core supply voltage. When MOS field-effect transistors are used in the I/O circuitry of such integrated circuits, the gate oxide layers of the transistors in the interface circuitry may need to be thicker than those comprising the core circuitry in order to tolerate I/O voltages that exceed the core supply voltage. In counteracting the degradation in output drive that may result from thickening the gate oxide layer, the pull-down signal applied to the gate of the pull-down transistor is preferably level-shifted from the core supply voltage to the higher external operating voltage associated with the I/O standard being supported. This external voltage is made available to the level-shifting circuit preferably through a spare pin or a gated I/O pin.

26 Claims, 7 Drawing Sheets

INPUT/OUTPUT DRIVERS

CROSS REFERENCE TO RELATED APPLICATION

This claims the benefit of U.S. Provisional Patent Application No. 60/133,384, filed May 10, 1999.

BACKGROUND OF THE INVENTION

This invention relates to input/output (I/O) drivers for integrated circuits, and more particularly to a technique for enhancing the output drive of I/O drivers in integrated circuits whose supply voltages are lower than the operating voltages associated with the I/O standards being supported.

Continuing advances in semiconductor process technology have contributed to the proliferation of I/O standards with ever-lower operating voltages. In particular, as critical feature sizes for MOS processes are scaled down to achieve greater densities and performance enhancements, the supply voltages are often scaled down proportionally to decrease power consumption and to avoid reliability problems.

For integrated circuits that are used in a wide variety of applications (e.g., programmable logic devices), reliable interoperability with systems employing different I/O signalling voltages has become an important design consideration as a result of this trend in power supply scaling. A variety of design considerations relating to interfacing devices in mixed-voltage environments, such as handling overvoltage conditions and producing compatible signalling levels, are addressed in commonly-assigned U.S. Pat. Nos. 6,147,511 and 6,118,302, both of which are hereby incorporated by reference herein in their entireties.

Often, an integrated circuit fabricated in the most current process will have to support I/O standards from earlier generations, thereby interfacing with I/O voltages that are, most likely, higher than the associated core supply voltage and/or the associated I/O supply voltage of that integrated circuit. As a consequence, the transistors comprising the I/O circuitry will often have thicker gate oxides than those in the core circuitry in order to operate more reliably with I/O voltages that may be higher than the internal supplies.

Although thick oxide transistors may reliably operate with a wider range of signalling voltages, the thicker gate oxide layer may degrade the output drive of these transistors. For NMOS transistors, increasing the gate oxide thickness may further aggravate the problem of reduced output drive arising from the ever-lower logic HIGH gate drive signals available as a result of power supply scaling. The decrease in output drive can be offset by using larger transistors; however, this option is not always desirable as it may increase the size of the chip.

SUMMARY OF THE INVENTION

It is therefore an object of this invention to provide a technique for enhancing the output drive capacity of the output drivers on an integrated circuit supporting I/O signalling levels that are higher than the supply voltages of that integrated circuit without resorting to increasing the size of the output driver transistors.

A representative output driver that is to be improved in accordance with the present invention is typically found in an integrated circuit, preferably fabricated in a MOS process, that supports I/O signalling levels higher than the associated core supply voltage and/or the associated I/O supply voltage of that integrated circuit. In order to ensure that the I/O transistors can tolerate voltages higher than the intrinsic supply levels, the gate oxide layers of these transistors are often thicker than that of the transistors comprising the core circuitry.

In accordance with the present invention, a preferred way of enhancing the output drive of output drivers comprising thick oxide transistors is to level-shift the logic HIGH pull-down signals that are applied to the gates of the pull-down transistors in the output drivers, preferably to the higher termination, reference, or signalling voltage associated with the I/O standard being supported. This higher external voltage is preferably provided to the level-shifting circuitry through any spare or unused pin (e.g., I/O pin, reference pin, power pin, etc.).

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which:

FIG. 1b is a schematic representation of an alternative embodiment of the output driver of FIG. 1a;

FIG. 4b shows an alternative embodiment of the circuit of FIG. 4a;

FIG. 5b shows an alternative embodiment of the circuit of FIG. 5a;

FIG. 6b is a schematic representation of an alternative embodiment of the level-shifting circuit of FIG. 6a;

DETAILED DESCRIPTION OF THE INVENTION

Figure 1A:
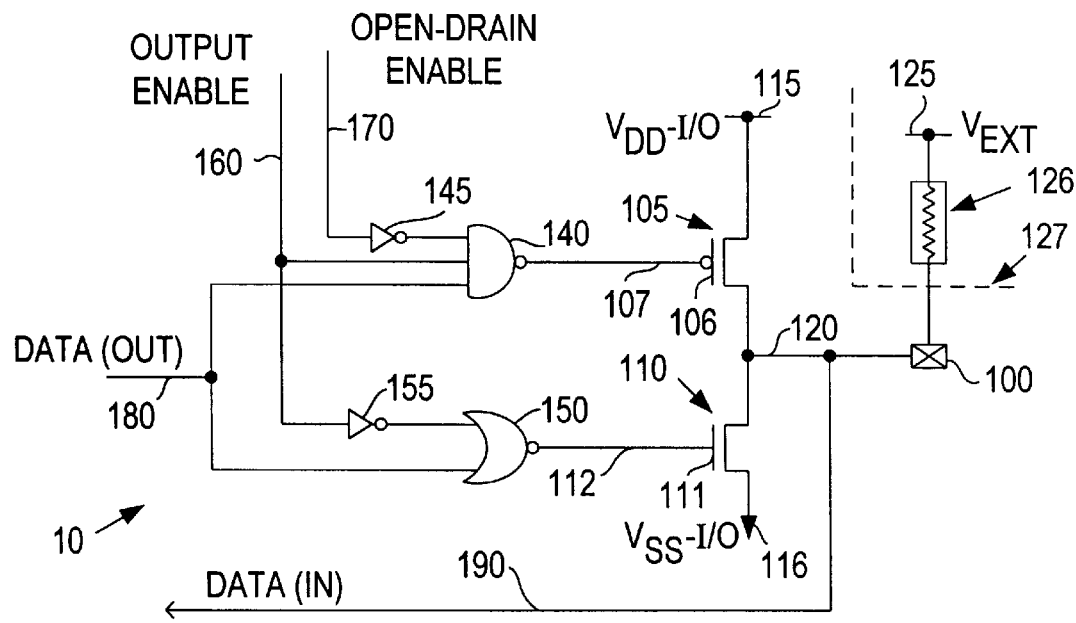
FIG. 1a is a schematic representation of the output driver portion of a conventional I/O driver.

FIG. 1a shows the output driver portion 10 of a conventional I/O driver which may be used in a variety of integrated circuits typically fabricated in a MOS process. Output driver 10 is powered by I/O power rail 115, which supplies $V_{DD-I/O}$. I/O power rail 115 can either be a part of or be separate from the core power supply. If I/O power rail 115 is separate from the core power supply, the level of $V_{DD-I/O}$ may or may not be equal to the core power supply level.

Output driver 10, which drives output signals onto I/O pin 100, is preferably configurable to operate either as a CMOS output driver or as an open-drain output driver, depending on the level of the OPEN-DRAIN ENABLE signal on lead 170. When OPEN-DRAIN ENABLE is logic LOW, output driver 10 is able to operate as a tristatable CMOS output driver. Conversely, when OPEN-DRAIN ENABLE is logic HIGH, PMOS transistor 105 is disabled and output driver 10 may then be operated as a tristatable open-drain output driver when an external pull-up device, such as resistor 126, is connected between I/O pin 100 and an external power rail 125, which preferably supplies an external voltage $V_{EXT}$ associated with the I/O signalling standard being supported. Dotted line 127 surrounds those elements of FIG. 1*a* which are external to the integrated circuit of which output driver 10 is a part. For output drivers that are dedicated to open-drain operation, PMOS transistor 105, along with its control circuitry, may be removed as in output driver 11, shown in FIG. 1*b*. Alternatively, if output driver 10 is to be used as a CMOS output driver only, the control circuitry associated with the OPEN-DRAIN ENABLE signal (i.e., lead 170 and inverter 145) may be removed.

Figure 1B:
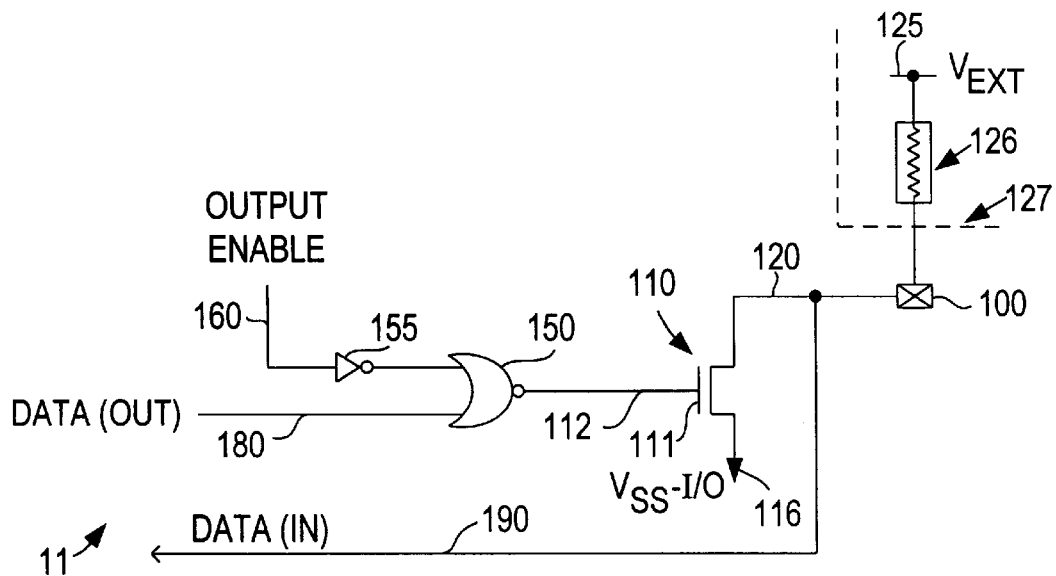

Because I/O pin 100 may also be used to receive input signals, output driver 10 preferably includes output enable control circuitry. The output enable control circuitry in FIG. 1*a* comprises NAND gate 140, inverter 155, and NOR gate 150. This output enable control circuitry is merely exemplary; any of a variety of conventional output enable control schemes may be used with output driver 10. When I/O pin 100 is to be used as an output, the OUTPUT ENABLE signal on lead 160 is set to logic HIGH, thereby enabling output driver 10 to drive an output signal present on DATA(OUT) lead 180 onto I/O pin 100. Conversely, when an input signal is to be received by I/O pin 100 and conveyed internally via DATA(IN) lead 190, the OUTPUT ENABLE signal on lead 160 is set to logic LOW, thereby disabling output driver 10 by turning off both PMOS transistor 105 and NMOS transistor 110. The operation of the output enable circuitry for output driver 11 in FIG. 1*b* is similar to that of output driver 10.

To ensure that output driver 10 is able to reliably interface with I/O standards with operating voltages that exceed the intrinsic supply levels (e.g., $V_{EXT}$ is greater than $V_{DD-I/O}$, or $V_{DD-I/O}$ is set to $V_{EXT}$ which is greater than the core supply level, etc.), the gate oxide layers of PMOS transistor 105 and NMOS transistor 110 may need to be thicker than that of the transistors comprising the core circuitry. Unfortunately, thickening the gate oxide may degrade the output drive capacity of output driver 10.

Figure 2A:
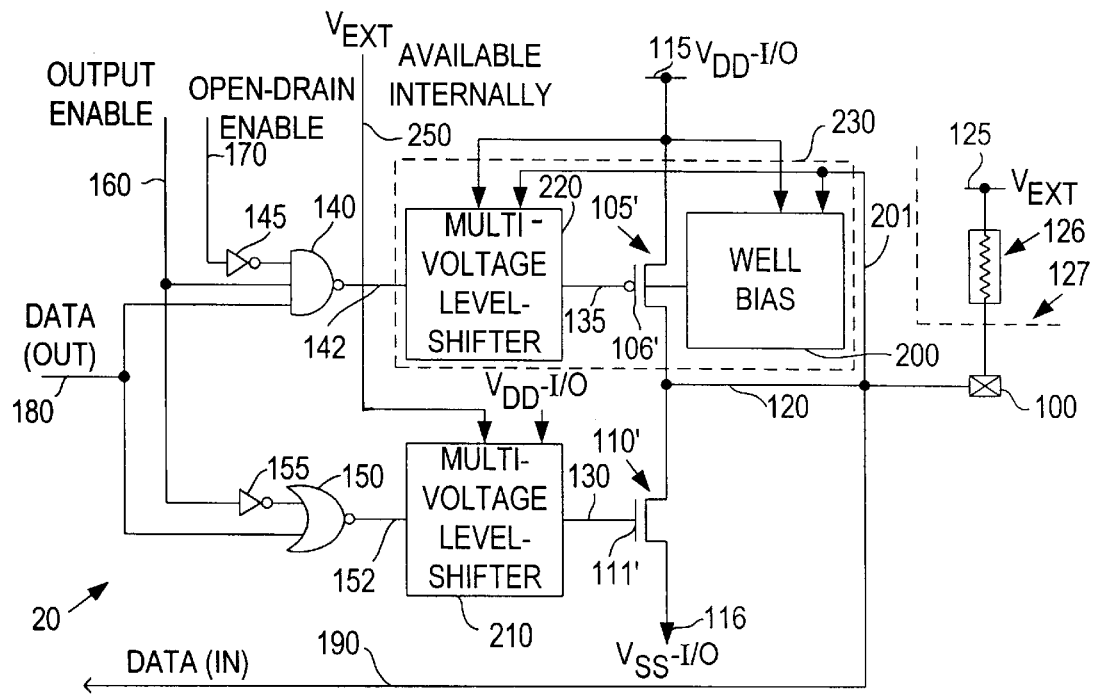
FIG. 2a is a schematic representation of the output driver of FIG. 1a which has been improved in accordance with the present invention.
Figure 2B:
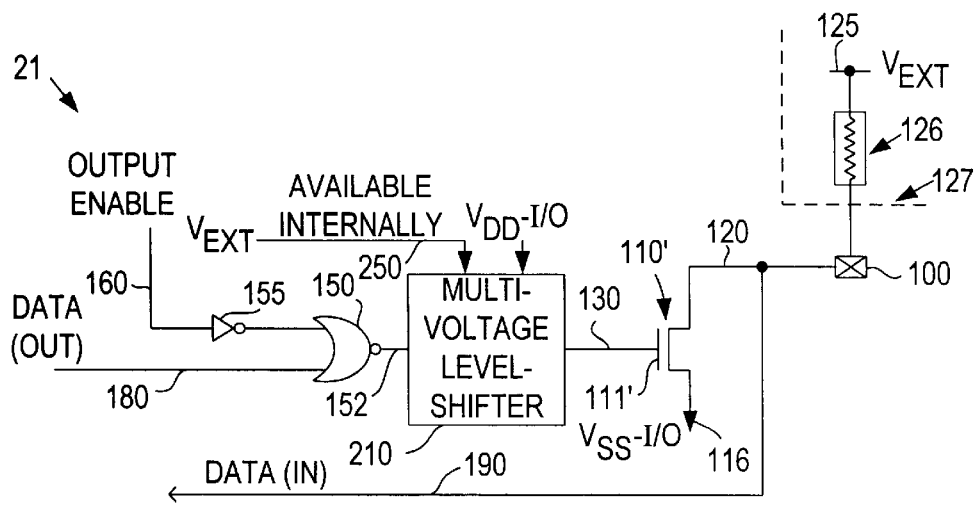
FIG. 2b is a schematic representation of the output driver of FIG. 1b which has been improved in accordance with the present invention.

The present invention seeks to counter this decrease in output drive with an improved output driver 20, shown in FIG. 2*a*, which provides an example of how output driver 10 may be modified to accommodate I/O signalling voltages higher than the core supply voltage and/or $V_{DD-I/O}$. Similarly, FIG. 2*b* shows an improved output driver 21 which provides one example of how output driver 11 in FIG. 1*b* may be similarly modified. In output driver 20, PMOS transistor 105' and NMOS transistor 110' are thick oxide versions of PMOS transistor 105 and NMOS transistor 110 in output driver 10. Compared to transistors 105 and 110, the thicker oxide transistors 105' and 110' may operate more reliably with external I/O voltages higher than the core supply and/or $V_{DD-I/O}$.

Because the presence of higher external I/O voltages on I/O pin 100 may prevent PMOS transistor 105' from turning off properly, a multi-voltage level-shifter 220 is preferably provided in output driver 20 which level-shifts the logic HIGH turn-off signal applied to the gate 106' of PMOS transistor 105' to the higher voltage between $V_{DD-I/O}$ and the voltage on I/O pin 100. Additionally, a well-biasing circuit 200 is also preferably provided for PMOS transistor 105' to ensure that the parasitic diode between the p-diffusion used to form the drain of PMOS transistor 105' and the n-well in which PMOS transistor 105' resides does not become forward biased when the voltage on I/O pin 100 exceeds $V_{DD-I/O}$. As in the case of multi-voltage level-shifter 220, well-biasing circuit 200 also preferably chooses the higher voltage between $V_{DD-I/O}$ and the external voltage on I/O pin 100. A preferred way of implementing multi-voltage level-shifter 220 and well-biasing circuit 200 is shown in FIG. 3, which provides one example of how the structures encompassed by dotted box 230 may be implemented.

Figure 3:
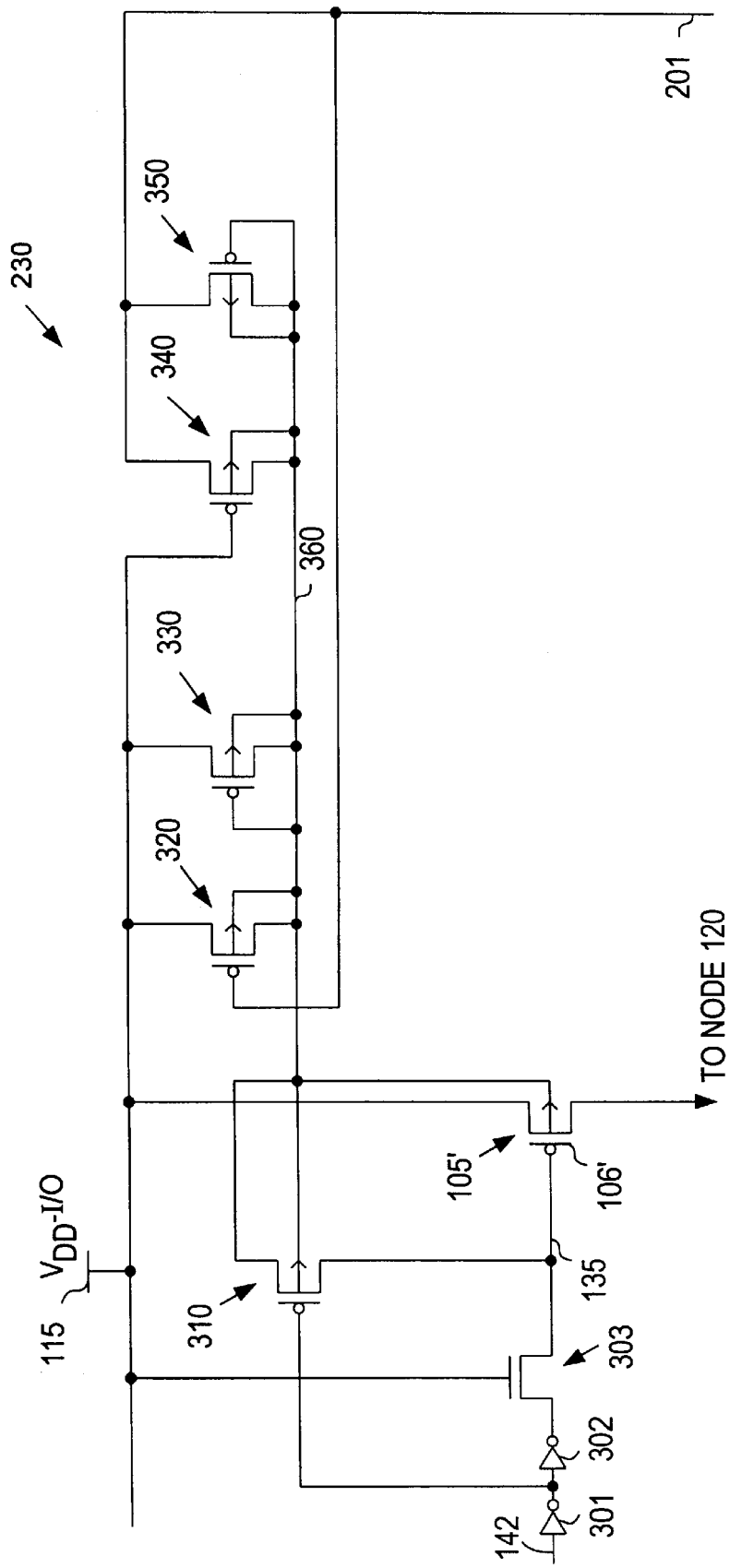
FIG. 3 shows a portion of the output driver of FIG. 2a in greater detail.

In FIG. 3, PMOS transistors 320, 330, 340, and 350 comprise a well-biasing arrangement which makes available on node 360 the higher voltage between $V_{DD-I/O}$ on I/O power rail 115 and the external voltage on I/O pin 100, which is present on lead 201. The voltage on node 360, which is used to bias the well of PMOS transistor 105', is also used to level-shift the logic HIGH turn-off signal that is applied to the gate 106' of PMOS transistor 105' via PMOS transistor 310. Because transistors 320, 330, 340, 350, 310, and 303 may be subjected to voltage levels that are higher than the core supply voltage and/or $V_{DD-I/O}$, it is preferable that these transistors are thick oxide devices. Further details on the operation of the circuit shown in FIG. 3, along with possible alternative embodiments, are provided in above-incorporated U.S. Pat. No. 6,147,511.

Returning to FIG. 2*a*, NMOS transistor 110' in output driver 20 may also be subjected to voltages higher than the core supply voltage and/or $V_{DD-I/O}$ on I/O pin 100. As a result, NMOS transistor 110' preferably has a thicker gate oxide layer than the transistors comprising the core circuitry. As discussed previously, increasing the gate oxide thickness may decrease the output drive capacity of a transistor. To compensate for the loss of output drive, the size of NMOS transistor 110' may be increased; however, this option may be undesirable as it may increase the size of the chip. The present invention seeks to provide an alternative to increasing the size of the transistors for enhancing the output drive of thick oxide devices. The increase in output drive is preferably achieved by level-shifting the logic HIGH pull-down signal applied to the gate 111' of NMOS transistor 110' from $V_{DD-I/O}$ to the higher external voltage, $V_{EXT}$ (e.g., the termination voltage, reference voltage, etc.), associated with the I/O standard being supported via multi-voltage level-shifter 210. As shown in FIG. 2*a*, multi-voltage level-shifter 210 is preferably a general-purpose level-shifter that is capable of selecting the higher voltage between $V_{DD-I/O}$ and $V_{EXT}$ as the voltage to which the logic HIGH pull-down signal is to be level-shifted.

Figure 4A:
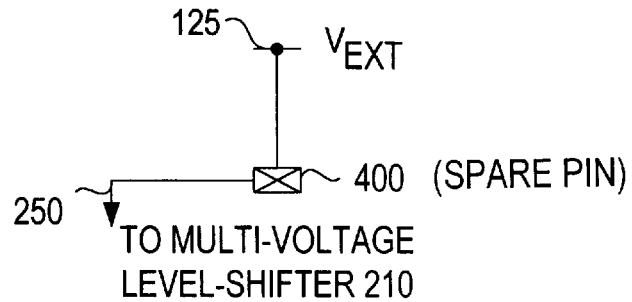
FIG. 4a shows an aspect of the output drivers of FIGS. 2a and 2b in greater detail.
Figure 4B:
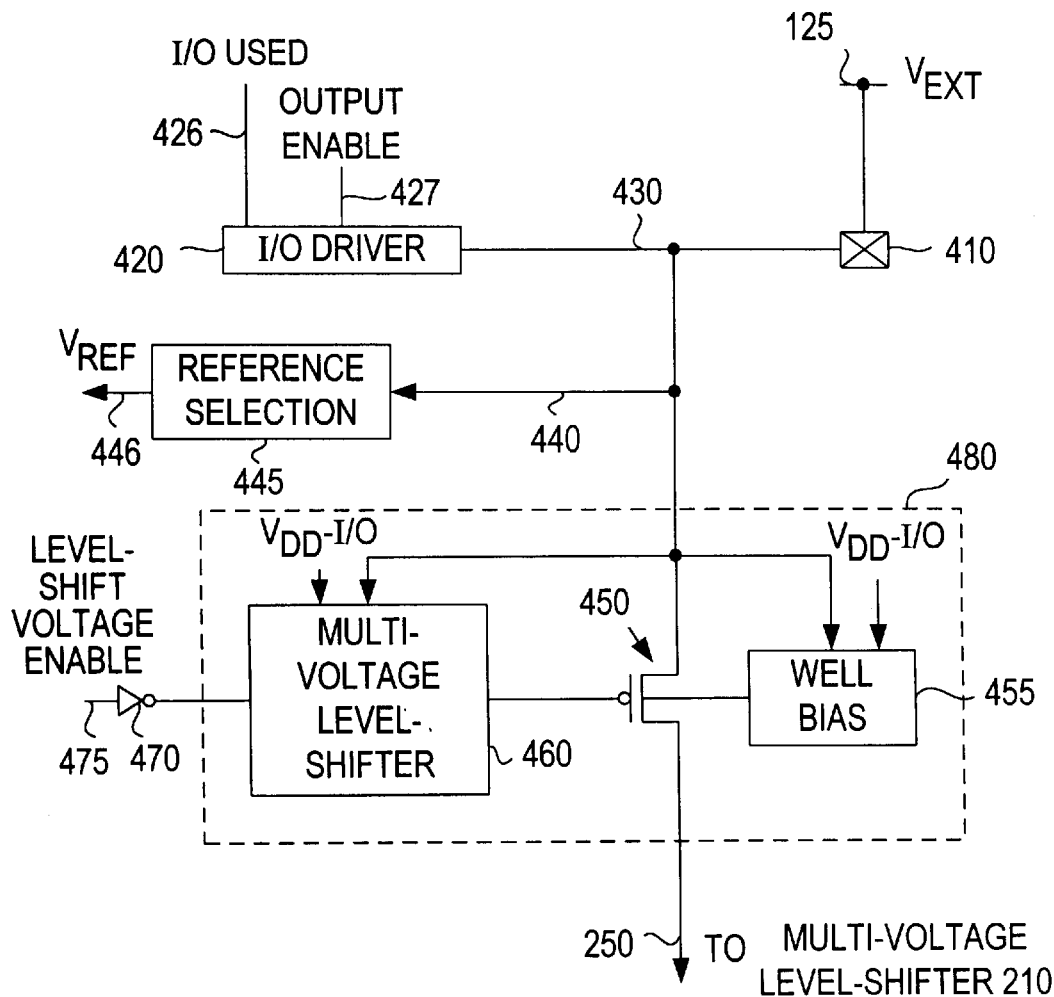

$V_{EXT}$ is preferably made available as an input to multi-voltage level-shifter 210 via lead 250. One way of achieving this is shown in FIG. 4*a* in which external power rail 125 is connected to a spare pin 400 from which $V_{EXT}$ can be provided to multi-voltage level-shifter 210 via lead 250. A preferred alternative to dedicating a spare pin for bringing in $V_{EXT}$ is shown in FIG. 4*b*, which illustrates an arrangement where an I/O pin 410 can also be used to provide $V_{EXT}$. The I/O driver 420 associated with I/O pin 410 is preferably responsive to an I/O USED signal on lead 426. For example, when I/O USED is logic HIGH, I/O driver 420 may be configured to drive output signals onto I/O pin 410 or to receive input signals, depending on the value of the OUTPUT ENABLE signal on lead 427. Conversely, when I/O USED is logic LOW, I/O driver 420 is disabled, thereby allowing I/O pin 410 to be connected to external power rail 125. Through I/O pin 410, $V_{EXT}$ is preferably provided to level-shift voltage enable circuit 480 which controls whether or not $V_{EXT}$ is provided to the multi-voltage level-shifters via lead 250. (Alternatively, $V_{EXT}$ may also be made available to a reference voltage select on circuit 445.)

Level-shift voltage enable circuit 480 preferably comprises a PMOS transistor 450, which is preferably a thick oxide device, a well-biasing circuit 455, and a multi-voltage level-shifter 460. Preferably, level-shift voltage enable circuit 480 is similar in structure to the portion of output driver 20 in FIG. 2a within dotted box 230. Accordingly, level-shift voltage enable circuit 480 may be implemented with a circuit which is similar to that shown in FIG. 3.

When the LEVEL-SHIFT VOLTAGE ENABLE signal on lead 475 is logic HIGH, a logic LOW is provided to multi-voltage level-shifter 460 via inverter 470. Multi-voltage level-shifter 460 then applies a logic LOW to the gate of PMOS transistor 450, thereby turning on PMOS transistor 450 and making $V_{EXT}$ available to multi-voltage level-shifter 210 via lead 250. Conversely, when LEVEL-SHIFT VOLTAGE ENABLE is logic LOW, a logic HIGH is applied to multi-voltage level-shifter 460 via inverter 470. This logic HIGH signal is then preferably level-shifted by multi-voltage level-shifter 460 to the higher voltage between $V_{DD-I/O}$ and $V_{EXT}$ in order to ensure that PMOS transistor 450 is properly turned off. When PMOS transistor 450 is turned off, $V_{EXT}$ is not available on lead 250.

Figure 5A:
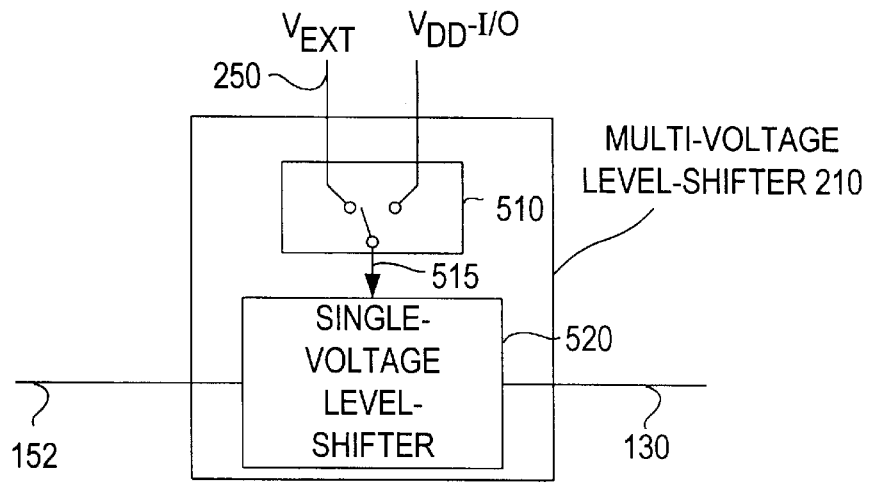
FIG. 5a shows a portion of the output drivers of FIGS. 2a and 2b in greater detail.

Returning to FIG. 2a, the multi-voltage level-shifter 210 that is used to level-shift the logic HIGH pull-down signal for NMOS transistor 110' is preferably configurable to choose the higher voltage between $V_{EXT}$ on lead 250 and $V_{DD-I/O}$, and to level-shift the logic HIGH pull-down signal accordingly. One example of how multi-voltage level-shifter 210 may be implemented is shown in FIG. 5a. According to FIG. 5a, multi-voltage level-shifter 210 may include a programmable switch 510 which allows either $V_{EXT}$ or $V_{DD-I/O}$ to be applied as an input to single-voltage level-shifter 520. If, however, it is desired that the selection of the higher voltage between $V_{EXT}$ or $V_{DD-I/O}$ be done without using programmable resources, FIG. 5b shows an alternative embodiment in which the selection of the higher voltage may be achieved by a voltage selection circuit 511 comprising PMOS transistors 530, 540, 550, and 560, which are preferably thick-oxide devices.

Figure 5B:
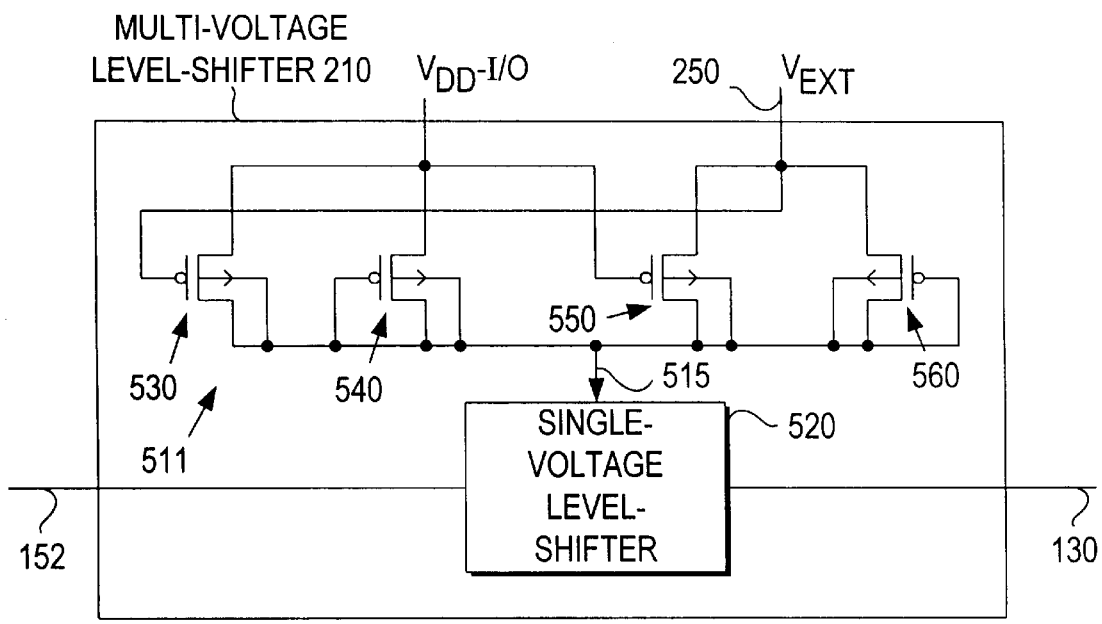
Figure 6A:
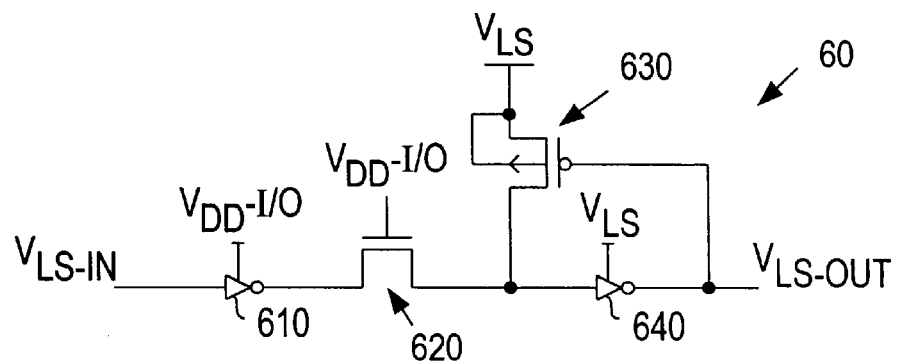
FIG. 6a is a schematic representation of a level-shifting circuit.
Figure 6B:
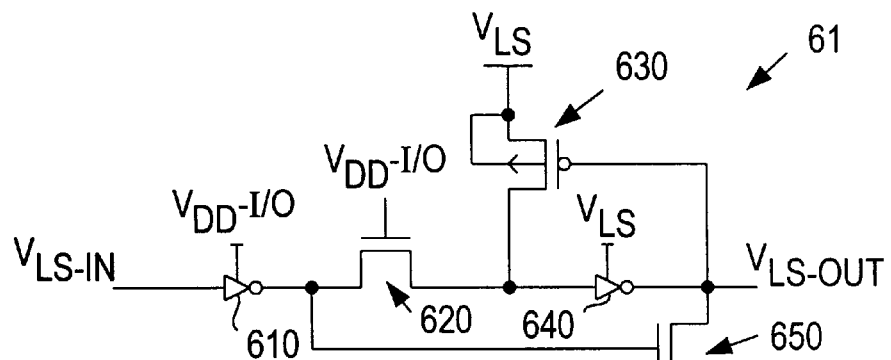
Figure 6C:
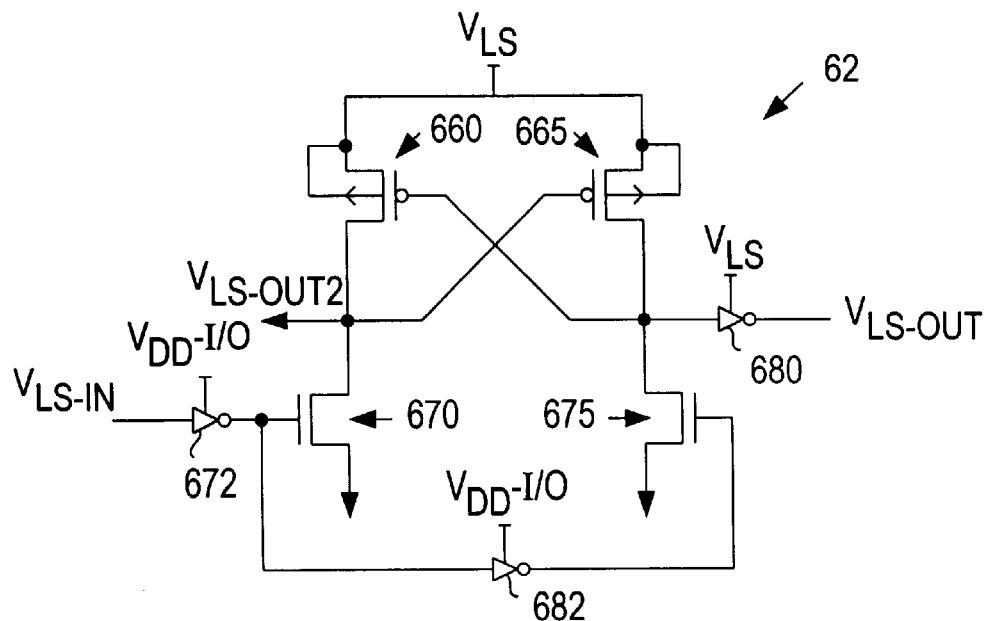
FIG. 6c is a schematic representation of another level-shifting circuit.

Single-voltage level-shifter 520 shown in FIGS. 5a and 5b may be implemented with a conventional level shifter. For example, any of level-shifters 60, 61, or 62 shown in FIGS. 6a, 6b, and 6c, respectively, may be suitable. Each of these level-shifters may be used as single-voltage level-shifter 520 in FIGS. 5a or 5b as follows: input terminal $V_{LS-IN}$ would be connected to lead 152, output terminal $V_{LS-OUT}$ would be connected to lead 130, and terminal $V_{LS}$ would be coupled to level-shift voltage input lead 515 of single-voltage level-shifter 520. Because level-shifters 60, 61, and 62 are non-inverting, when a logic HIGH is applied to $V_{LS-IN}$, a level-shifted logic HIGH will be made available on output terminal $V_{LS-OUT}$. When using level-shifter 62, an alternative non-inverting output terminal $V_{LS-OUT2}$ is also available. If $V_{DD-I/O}$ is very low, it may be preferable to use either level-shifter 61 or 62 shown in FIGS. 6b and 6c, respectively, rather than level-shifter 60 shown in FIG. 6a.

The resulting increase in the output drive of NMOS transistor 110' in output drivers 20 and 21 can be readily appreciated, for example, when $V_{DD-I/O}$ is 1.2V and NMOS transistor 110' has a threshold voltage of 0.6V. In the case of GTL+, $V_{EXT}$ may be the 1.5V termination voltage, which, in accordance with the square-law current characteristics of MOS field-effect transistors operating in the saturation region, would provide over twice as much output drive than the 1.2V $V_{DD-I/O}$. In order to achieve a comparable increase in output drive without level-shifting, the size of NMOS transistor 110' may have to be more than doubled.

In accordance with the principles of the present invention, the above-described technique for improving output drive can be readily applied to a wide variety of output drivers (e.g., open-drain, CMOS, etc.) which may comprise any combination of elements whose output drive can be enhanced by having $V_{EXT}$ internally available. $V_{EXT}$ may be brought in through any spare or unused pin (e.g., an I/O pin, a reference pin, a power pin, etc.).

Figure 7:
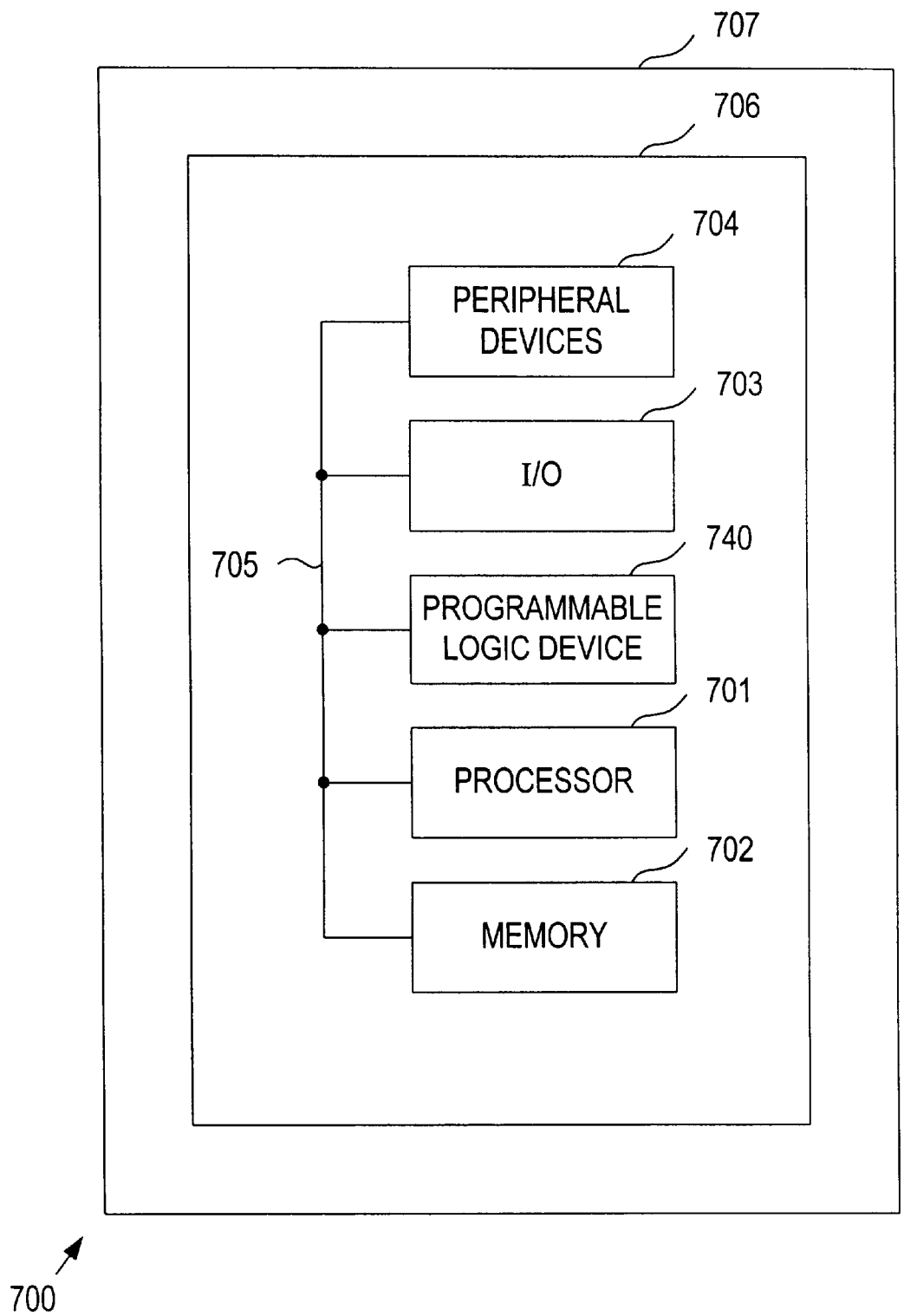
FIG. 7 is a simplified block diagram of an illustrative system employing a programmable logic device incorporating the improved output driver of FIG. 2a and/or FIG. 2b in accordance with the present invention.

FIG. 7 shows how a programmable logic device 740 employing the improved output driver 20 and/or 21 can be used in a system 700. System 700 can be used in a wide variety of applications, such as computer networking, data networking, instrumentation, video processing, digital signal processing, or any other application where the advantage of using programmable or reprogrammble logic is desirable. Programmable logic device 740 employing the improved output driver 20 and/or 21 can be used to perform a variety of different logic functions. For example, programmable logic device 740 can be configured as a processor or controller that works in cooperation with processor 701. Programmable logic device 740 may also be used as an arbiter for arbitrating access to a shared resource in system 700. In yet another example, programmable logic device 740 can be configured as an interface between processor 701 and one of the other components in system 700. It should be noted that system 700 is only exemplary, and that the true scope and spirit of the invention should be indicated by the following claims.

Various technologies can be used to implement an integrated circuit employing the improved output drivers 20 and 21, such as programmable logic device 740, according to this invention. Moreover, this invention is applicable to both one-time-only programmable and reprogrammable devices.

Thus, it is seen that a technique for improving the output drive capacity of an output driver for an integrated circuit that supports an I/O standard featuring a termination, reference, or signalling voltage greater than the intrinsic core supply voltage has been provided. One skilled in the art will appreciate that the present invention can be practiced by other than the described embodiments, which are presented for purposes of illustration and not of limitation, and the present invention is limited only by the claims which follow.

What is claimed is:

1. On an integrated circuit having interface circuitry and being configured to be powered by at least one supply voltage, an output driver for said interface circuitry, comprising:

an open-drain pull-down device having a drive signal terminal and an open-drain terminal, wherein said open-drain terminal is configured to be coupled to an external pull-up device; and a level-shifting circuit having a first voltage lead, a second voltage lead, an input lead, and an output lead, said output lead being connected to said drive signal terminal, wherein said level-shifting circuit is configured to convert an input voltage applied on said input lead to an output voltage available on said output lead that is substantially similar to a first voltage applied on said first voltage lead, and wherein said level-shifting circuit is further configured to convert said input voltage to a second voltage applied on said second voltage lead instead of said first voltage if said second voltage is higher than said first voltage.

2. The output driver defined in claim 1 wherein said first voltage lead is connected to a level-shift voltage enable circuit, said level-shift voltage enable circuit being coupled to an input/output pin that is connected to a selectively disableable input/output driver, said input/output pin being further connected to an external voltage source that provides said first voltage, wherein said first voltage is higher than said supply voltage.

3. A digital processing system comprising:
processing circuitry;
a system memory coupled to said processing circuitry; and
a programmable logic array integrated circuit device having the output driver defined in claim 1 and being coupled to said processing circuitry and the system memory.

4. A printed circuit board on which is mounted a programmable logic array integrated circuit device having the output driver defined in claim 1.

5. The printed circuit board defined in claim 4 further comprising:
a board memory mounted on the printed circuit board and coupled to the programmable logic array integrated circuit device.

6. The printed circuit board defined in claim 5 further comprising:
processing circuitry mounted on the printed circuit board and coupled to the board memory.

7. The output driver defined in claim 1 wherein said first voltage is greater than said supply voltage.

8. On an integrated circuit having interface circuitry and being configured to be powered by at least one supply voltage, an output driver for said interface circuitry, comprising:
an open-drain pull-down device having a drive signal terminal and an open-drain terminal;
a level-shifting circuit having a first voltage lead, an input lead, and an output lead, said output lead being connected to said drive signal terminal, wherein said level-shifting circuit is configured to convert an input voltage applied on said input lead to an output voltage available on said output lead that is substantially similar to a first voltage applied on said first voltage lead; and
an external pull-up device connected between said open-drain terminal and an external voltage source, wherein said external voltage source provides an external voltage that is substantially similar to said first voltage and is higher than said supply voltage.

9. The output driver defined in claim 8 wherein said level-shifting circuit further comprises a second voltage lead on which a second voltage is applied, wherein said level-shifting circuit is further configured to convert said input voltage to said second voltage instead of said first voltage if said second voltage is higher than said first voltage.

10. The output driver defined in claim 8, wherein said first voltage lead is connected to a spare pin on said integrated circuit, said spare pin being further connected to said external voltage source.

11. The output driver defined in claim 8 wherein said first voltage lead is connected to a level-shift voltage enable circuit, said level-shift voltage enable circuit being coupled to an input/output pin that is connected to a selectively disableable input/output driver, said input/output pin being further connected to said external voltage source.

12. A digital processing system comprising:
processing circuitry;
a system memory coupled to said processing circuitry; and
a programmable logic array integrated circuit device having the output driver defined in claim 8 and being coupled to said processing circuitry and the system memory.

13. A printed circuit board on which is mounted a programmable logic array integrated circuit device having the output driver defined in claim 8.

14. On an integrated circuit having interface circuitry and being configured to be powered by at least one supply voltage, an output driver for said interface circuitry, comprising:
an open-drain pull-down device having a drive signal terminal and an open-drain terminal, wherein said open-drain terminal is configured to be coupled to an external pull-up device; and
a level-shifting circuit having a first voltage lead, an input lead, and an output lead, said output lead being connected to said drive signal terminal, wherein said level-shifting circuit is configured to convert an input voltage applied on said input lead to an output voltage available on said output lead that is substantially similar to a first voltage applied on said first voltage lead, and wherein said first voltage lead is connected to a spare pin on said integrated circuit, said spare pin being further connected to an external voltage source that provides said first voltage, wherein said first voltage is higher than said supply voltage.

15. The output driver defined in claim 14 wherein said level-shifting circuit further comprises a second voltage lead on which a second voltage is applied, wherein said level-shifting circuit is further configured to convert said input voltage to said second voltage instead of said first voltage if said second voltage is higher than said first voltage.

16. A digital processing system comprising:
processing circuitry;
a system memory coupled to said processing circuitry; and
a programmable logic array integrated circuit device having the output driver defined in claim 14 and being coupled to said processing circuitry and the system memory.

17. A printed circuit board on which is mounted a programmable logic array integrated circuit device having the output driver defined in claim 14.

18. For use in an integrated circuit having interface circuitry and being configured to be powered by at least one supply voltage, a method for improving output drive for an output driver on said interface circuitry, comprising:
providing an open-drain pull-down device having a drive signal terminal and an open-drain terminal, wherein said open-drain terminal is configured to be coupled to an external pull-up device;
using a level-shifting circuit having a first voltage lead, a second voltage lead, an input lead, and an output lead connected to said drive signal terminal, to convert an input voltage applied on said input lead to an output voltage available on said output lead that is substantially similar to a first voltage applied on said first voltage lead; and converting said input voltage to a second voltage applied on said second voltage lead instead of said first voltage if said second voltage is higher than said first voltage.

19. The method defined in claim 18 further comprising:

connecting said first voltage lead to a level-shift voltage enable circuit;

coupling said level-shift voltage enable circuit to an input/output pin that is connected to a selectively disableable input/output driver; and connecting said input/output pin to an external voltage source that provides said first voltage, wherein said first voltage is higher than said supply voltage.

20. The method defined in claim 18 further comprising applying an external voltage greater than said supply voltage on said first voltage lead, said external voltage being said first voltage.

21. For use in an integrated circuit having interface circuitry and being configured to be powered by at least one supply voltage, a method for improving output drive for an output driver on said interface circuitry, comprising:

providing an open-drain pull-down device having a drive signal terminal and an open-drain terminal;

using a level-shifting circuit having a first voltage lead, an input lead, and an output lead connected to said drive signal terminal, to convert an input voltage applied on said input lead to an output voltage available on said output lead that is substantially similar to a first voltage applied on said first voltage lead; and connecting an external pull-up device between said open-drain terminal and an external voltage source, wherein said external voltage source provides an external voltage that is substantially similar to said first voltage and is higher than said supply voltage.

22. The method defined in claim 21 further comprising providing a second voltage to said level-shifting circuit on a second voltage lead and converting said input voltage to said second voltage instead of said first voltage if said second voltage is higher than said first voltage.

23. The method defined in claim 21 further comprising:

connecting said first voltage lead to a spare pin on said integrated circuit; and connecting said spare pin to said external voltage source.

24. The method defined in claim 21 further comprising:

connecting said first voltage lead to a level-shift voltage enable circuit;

coupling said level-shift voltage enable circuit to an input/output pin that is connected to a selectively disableable input/output driver; and connecting said input/output pin to said external voltage source.

25. For use in an integrated circuit having interface circuitry and being configured to be powered by at least one supply voltage, a method for improving output drive for an output driver on said interface circuitry, comprising:

providing an open-drain pull-down device having a drive signal terminal and an open-drain terminal, wherein said open-drain terminal is configured to be coupled to an external pull-up device;

using a level-shifting circuit having a first voltage lead, an input lead, and an output lead connected to said drive signal terminal, to convert an input voltage applied on said input lead to an output voltage available on said output lead that is substantially similar to a first voltage applied on said first voltage lead;

connecting said first voltage lead to a spare pin on said integrated circuit; and connecting said spare pin to an external voltage source that provides said first voltage, wherein said first voltage is greater than said supply voltage.

26. The method defined in claim 25 further comprising providing a second voltage to said level-shifting circuit on a second voltage lead and converting said input voltage to said second voltage instead of said first voltage if said second voltage is higher than said first voltage.

* * * * *